United States Patent [19]

Sumi et al.

[11] 4,413,300
[45] Nov. 1, 1983

[54] LINE DRIVER CIRCUIT HAVING A PROTECTIVE CIRCUIT AGAINST EXCESS CURRENTS

[75] Inventors: Hideji Sumi, Yokohama; Masayuki Kokado, Kawasaki, both of Japan

[73] Assignee: Fujitsu Limited, Kanagawa, Japan

[21] Appl. No.: 310,974

[22] Filed: Oct. 13, 1981

[30] Foreign Application Priority Data

Oct. 13, 1980 [JP] Japan ............................. 55-142603

[51] Int. Cl.$^3$ ............................................ H02H 3/08
[52] U.S. Cl. .................................. 361/98; 330/207 P; 330/298; 361/101
[58] Field of Search ................. 361/98, 101; 330/298, 330/207 P

[56] References Cited

U.S. PATENT DOCUMENTS 3,678,408  7/1972  Suzuki ............................. 330/298
3,796,943  3/1974  Nelson et al. .................... 361/98 X

FOREIGN PATENT DOCUMENTS 1613894  10/1970  Fed. Rep. of Germany ........ 361/98

OTHER PUBLICATIONS

"A Programmable operational amplifier" Elektron. Prak. (Germany) vol. 11, No. 11 (11/1976).

Primary Examiner—Harry E. Moose, Jr.
Attorney, Agent, or Firm—Staas & Halsey

[57] ABSTRACT

A line driver circuit having a protective circuit against excess currents, which includes a protective transistor for limiting the output current of an output-stage emitter-follower transistor. A detecting means for detecting the output current of the emitter-follower transistor and a pull-up transistor for pulling up the base potential of the protective transistor are provided. Before the output current becomes too large, the detecting means detects the output current to turn on the pull-up transistor. Then the base potential of the protective transistor is pulled up to turn on the protective transistor. As a result the base current of the emitter-follower transistor is decreased, so that the emitter-follower transistor is protected from being thermally destroyed.

13 Claims, 5 Drawing Figures

LINE DRIVER CIRCUIT HAVING A PROTECTIVE CIRCUIT AGAINST EXCESS CURRENTS

BACKGROUND OF THE INVENTION

1. Field of the Invention

The present invention relates to a line driver circuit having a protective circuit against excess currents, for protecting a transistor at the output stage from being thermally destroyed by a short circuit in the output circuit.

The line driver circuit is used to transmit signals from, for example, a terminal unit, through a transmission line, to a computer a long distance away, or vice versa. If a short occurs in the load of the line driver circuit, for example, in the transmission line, excess currents flow through transistors which are provided in the output stage, resulting in a thermal destruction of the transistors. The shorts may occur by, for example, a faulty connection of the transmission line to the line driver circuit during an inspection of the circuit.

2. Description of the Prior Art

In a conventional line driver circuit, a protective circuit for protecting the output-stage transistor from being thermally destroyed is provided as will be hereinafter described in detail. However, there are disadvantages in the conventional line driver circuit. The first disadvantage is that the maximum short-circuit current flowing through the output-stage transistor is too large to protect the output-stage transistor as hereinafter described in detail. The second disadvantage is that thhe maximum short-circuit current flowing through the output-stage transistor cannot be precisely determined, because the maximum short-circuit current is determined by resistances and the characteristics of the transistors, both having variations due to the manufacturing processes, as will be hereinafter described in detail.

SUMMARY OF THE INVENTION

Accordingly, an object of the present invention is to provide a line driver circuit having a protective circuit against excess currents, in which the maximum short-circuit current flowing through the output-stage transistor is minimized.

Another object of the present invention is to provide a line driver circuit having a protective circuit against excess currents, in which the maximum short-circuit current can be determined precisely regardless of variations in the resistances or the characteristics of the transistors.

In order to achieve the above objects, according to the present invention, there is provided a line driver circuit having a protective function against excess currents, comprising: an emitter-follower transistor provided on the output stage of the line driver circuit; a protective transistor for limiting the output currents of the emitter-follower transistor; a detecting means for detecting the output currents of the emitter-follower transistor; and, a pull-up transistor which is turned on when the voltage detected by the detecting means exceeds a predetermined value for pulling up the base potential of the protective transistor to turn on the protective transistor.

The foregoing objects and other objects as well as the characteristic features of the invention will become more apparent and more readily understandable through the following description and the appended claims when read in conjunction with the accompanying drawings.

DESCRIPTION OF THE PREFERRED EMBODIMENTS

Figure 1:
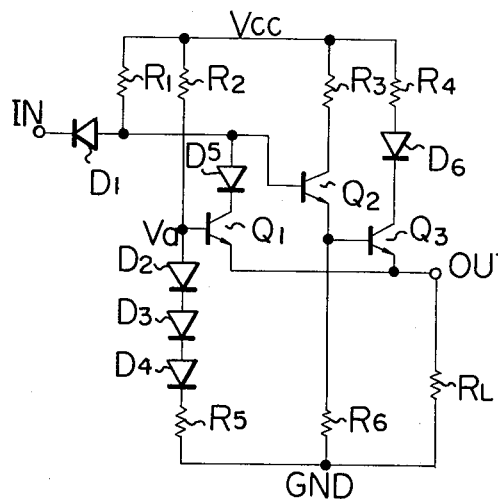
FIG. 1 is a circuit diagram illustrating a conventional line driver circuit having a protective circuit against excess currents.

Before explaining the preferred embodiments of the present invention, a conventional line driver circuit having a protective circuit against excess currents will first be described with reference to FIGS. 1 and 2. Referring to FIG. 1, $Q_1$ represents a protective transistor; and, $Q_2$ and $Q_3$ constitute an emitter-follower circuit at the output stage of the line driver circuit. The base of the transistor $Q_1$ is connected through a pull-up resistor $R_2$ to a power supply line Vcc. The potential at the base of the transistor $Q_1$ is clamped to a predetermined value Va by diodes $D_2$, $D_3$ and $D_4$ and a bias resistor $R_5$ connected in series between the base of the transistor $Q_1$ and the ground. The emitter of the transistor $Q_1$ is connected to an output terminal OUT. The collector of the transistor $Q_1$ is connected through a diode $D_5$ to the base of the transistor $Q_2$, the cathode of the diode $D_5$ being connected to the collector of the transistor $Q_1$. The diode $D_5$ prevents a reverse current from being conducted from the base to the collector when the transistor $Q_1$ goes into saturation. The base of the transistor $Q_2$ is connected through a diode $D_1$ to an input terminal IN, the cathode of the diode $D_1$ being connected to the input terminal IN. The collector of the transistor $Q_2$ is connected through a pull-up resistor $R_3$ to the power supply line Vcc. The emitter of the transistor $Q_2$ is connected through a bias resistor $R_6$ to the ground. The base of the transistor $Q_3$ is connected to the emitter of the transistor $Q_2$. The collector of the transistor $Q_3$ is connected through a diode $D_6$ and a pull-up resistor $R_4$ to the power supply line Vcc. The emitter of the transistor $Q_3$ is connected to the output terminal OUT. A load resistor $R_L$ is connected between the output terminal OUT and the ground. The diode $D_6$ also prevents a current from being conducted from the base to the collector when the transistor $Q_3$ goes into saturation.

In normal operation, when the potential at the input terminal IN is at a high level (hereinafter referred to as an H level) to cut off the diode $D_1$, a current is supplied from the power supply line $V_{cc}$ through the resistor $R_1$ to the base of the transistor $Q_2$ to turn it on so that the emitter current of the transistor $Q_2$ is supplied to the base of the transistor $Q_3$ to turn it on. Therefore, the potential at the output terminal OUT is at the H level. In contrast, when the potential at the input terminal IN is at a low level (hereinafter referred to as an L level), the diode $D_1$ is turned on so that a current flows from the power supply line Vcc through the resistor $R_1$, and the diode $D_1$ to the input terminal IN. Therefore, the transistor $Q_2$ receives no base current. As a result, the transistors $Q_2$ and $Q_3$ are turned off so that the potential at the output terminal OUT is at the L level.

In the circuit of FIG. 1, if the protective transistor $Q_1$ is not provided, and when the load resistor $R_L$ is short circuited so that its resistance is decreased, the collector current flowing through the transistor $Q_3$ is increased. When the collector current is excessive, the transistor $Q_3$ is thermally destroyed. The transistor $Q_1$ is provided for preventing the thermal destruction of the output-stage transistor $Q_3$. The potential at the base of the transistor $Q_1$ is clamped to the predetermined value Va as mentioned before. The value Va is so determined that Va is smaller than the potential at the output terminal in a normal state plus the voltage $V_{BE}$ between the base and the emitter of the transistor $Q_1$ to turn it on. Therefore, in a normal state, or when there is no short circuit across the load resistor $R_L$, the transistor $Q_1$ is in a cut-of state. However, when the potential at the output terminal is lowered due to, for example, a short circuit across the load resistor $R_L$, to a level lower than the difference between the values Va and $V_{BE}$, the protective transistor $Q_1$ turns on so that a current is conducted from the power supply line Vcc through the resistor $R_1$, and the diode $D_5$, the transistor $Q_1$ to the output terminal OUT. Therefore, because a part of the base current of the transistor $Q_2$ is bypassed through the protective transistor $Q_1$, the base current of the transistor $Q_3$ is decreased. As a result, the collector current of the transistor $Q_3$ is limited so that the transistor $Q_3$ is protected from being thermally destroyed.

The limitation of the current flowing through the output-stage transistor $Q_3$ will be described in more detail as follows. That is, when the output current is increased due to, for example, a short across the load resistor $R_L$, the collector current of the transistor $Q_3$ is also increased so that the voltage drop across the resistor $R_4$ is increased. Accordingly, the potential at the collector of the transistor $Q_3$ is lowered, resulting in a saturation of the transistor $Q_3$. When the transistor $Q_3$ is saturated, a current flows not only from the base to the emitter but also from the base to the collector so that its base current is increased. Accordingly, the emitter current of the transistor $Q_2$ is increased so that its collector current is increased, resulting in an increase in the voltage drop across the resistor $R_3$. As a result, because the potential at the collector of the transistor $Q_2$ is lowered, the transistor $Q_2$ is saturated. Then, the base current of the transistor $Q_2$ is increased so that the voltage drop across the resistor $R_1$ is increased. Therefore, the potential at the base of the transistor $Q_2$ is lowered, and accordingly, the potential at the output terminal OUT is lowered. When the potential at the output OUT terminal is lowered, the transistor $Q_1$ turns on and the transistors $Q_2$ and $Q_3$ are turned off as mentioned before, resulting in the limitation of collector current of the transistor $Q_3$.

Figure 2:
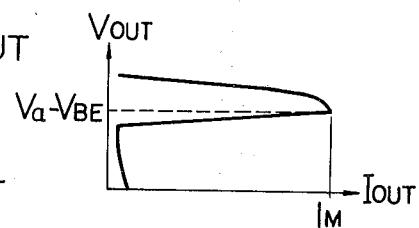
FIG. 2 is a graph for explaining the protective function of the circuit of FIG. 1.

FIG. 2 is a graph illustrating the relationship between the output current and the output voltage of the circuit of FIG. 1. Referring to FIGS. 1 and 2, let it be assumed that the potential at the output terminal OUT is at the H level, i.e., $V_{OH}$. When the output potential is lowered below the value $V_{OH}$ due to, for example, a short across the load resistor $R_L$, the output current $I_{OUT}$ is rapidly increased until the output potential reaches the value Va-$V_{BE}$. When the output potential decreases to the value Va-$V_{BE}$, the protective transistor $Q_1$ begins to turn on so that the output current is rapidly decreased from the maximum output $I_M$ to a minimum current. After this, even if the output potential $V_{OUT}$ is further lowered, the output current $I_{OUT}$ is not increased greatly.

The disadvantages of the conventional line driver circuit of FIG. 1 will now be described as follows.

The first disadvantage is that, because the maximum output current $I_M$ is determined by the lowered output potential Va-$V_{BE}$, and because the value Va must be smaller than the value $V_{OH}$ plus the value $V_{BE}$, the maximum output current $I_M$ is too large to protect the transistor $Q_3$. If the value Va is designed to have a value greater than $V_{OH}+V_{BE}$, the protective transistor $Q_1$ is easily turned on in the normal state, i.e., when the output potential reaches $V_{OH}$, and accordingly, the transistor $Q_1$ does not act as a protective transistor. Further, considering the noise margin, the value Va must be sufficiently lower than $V_{OH}+V_{BE}$, because, if a noise is applied to the input terminal IN, the output potential may be lowered below the value $V_{OH}$. In order to ensure that the transistor $Q_1$ is not turned on by such a noise, the value Va must be sufficiently low. Therefore, as will be seen from FIG. 2, the maximum output current is further increased in the conventional circuit of FIG. 1.

The second disadvantage is that the value of the maximum output current $I_M$ cannot be precisely determined. One of the reasons is that the value Va is determined by the clamping diodes $D_2$, $D_3$ and $D_4$ and the resistor $R_5$. Because the characteristics of these diodes and the resistor have variations due to various manufacturing steps, the value Va cannot be precisely determined to a designated value. Another reason is that the characteristic of the curve in the graph of FIG. 2 is determined by the characteristics of the resistors $R_1$, $R_3$, and $R_4$ and the saturation characteristics of the transistors $Q_2$ and $Q_3$, these characteristics also having variations due to various manufacturing steps.

The main object of the present invention is to overcome the above-mentioned disadvantages in the conventional line driver circuit.

Preferred embodiments of the present invention will now be described with reference to FIGS. 3 through 5.

Figure 3:
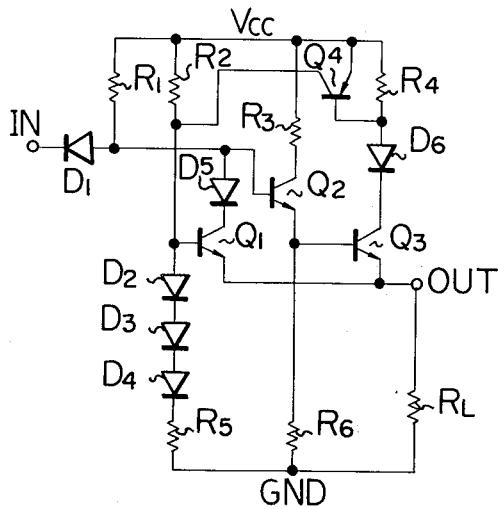
FIG. 3 is a circuit diagram illustrating a line driver circuit having a protective circuit against excess currents, according to an embodiment of the present invention.

FIG. 3 is a circuit diagram illustrating a line driver circuit having a protective circuit against excess currents, according to an embodiment of the present invention, in which like reference characters designate the same elements in the circuit of FIG. 1. The difference between the circuit of FIG. 3 and the circuit of FIG. 1 is that, in FIG. 3, a PNP transistor $Q_4$ is provided. The emitter of the transistor $Q_4$ is connected to the power supply line Vcc. The base of the transistor $Q_4$ is connected to the connecting point between the resistor $R_4$ and the diode $D_6$. The collector of the transistor $Q_4$ is connected to the base of the protective transistor $Q_1$. The resistor $R_4$ acts to detect excess currents. The transistor $Q_4$ acts to pull-up the base potential of the transistor $Q_1$ when an excess current is detected. More precisely, when the current flowing through the resistor $R_4$ is increased due to, for example, a short across the load resistor $R_L$, the voltage drop across the resistor $R_4$, that is, the voltage between the base and the emitter of the transistor $Q_4$, is increased so that the transistor $Q_4$ is turned on. Then, the base potential of the transistor $Q_1$ is pulled up through the transistor $Q_4$ to a value nearly equal to a power supply voltage Vcc. As a result, the transistor $Q_1$ is turned on. When the transistor $Q_1$ is turned on, the base current of the transistor $Q_2$ is decreased in the same way as in the circuit of FIG. 1, and accordingly, the collector current of the transistor $Q_3$ is decreased. Therefore, the transistor $Q_3$ is protected from being destroyed.

Figure 4:
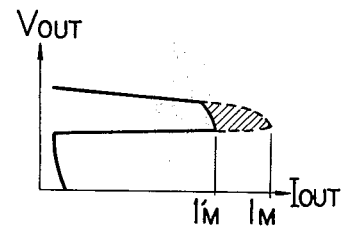
FIG. 4 is a graph for explaining the protective function against excess currents of the circuit of FIG. 3; and, FIG. 5 is a circuit diagram illustrating a line driver circuit having a protective circuit, according to another embodiment of the present invention.

FIG. 4 is a graph illustrating the relationship between the output current $I_{OUT}$ and the output voltage $V_{OUT}$ of the circuit of FIG. 3. As illustrated in FIG. 4, the maximum output current $I_{M'}$ of the circuit of FIG. 3 is smaller than the maximum output current $I_M$ of the circuit of FIG. 1. The maximum output current $I_{M'}$ of the circuit of FIG. 3 is determined as:

$$I_{M'} = V_{BE}/R_4,$$

where, $V_{BE}$ represents the voltage between the base and the emitter, of the transistor $Q_4$ to turn it on, and $R_4$ represents the resistance of the resistor $R_4$. The larger the resistance $R_4$, the smaller the maximum output current $I_{M'}$. Therefore, the maximum output current $I'_M$ can be made as small as possible by designing the resistance $R_4$ as an appropriately large resistance. Further, because the maximum output current $I_{M'}$ depends on only two parameters, i.e., the base-emitter voltage $V_{BE}$ and the resistance $R_4$, the maximum output current $I_{M'}$ can be designed more precisely than in the conventional case.

After the transistor $Q_1$ is turned on, the current flowing through the resistor $R_4$ is decreased as mentioned above so that the voltage between the base and the emitter of the transistor $Q_4$ is decreased to turn it off. Then, the base potential of the transistor $Q_1$ is lowered to the predetermined value Va. However, if the output potential at the output terminal OUT is still lowered, the protective transistor $Q_1$ is kept on because the voltage between the base and the emitter connected to the output terminal OUT is sufficiently large to turn on the transistor $Q_1$. Therefore, excess current does not flow through the output-stage transistor $Q_3$.

In the circuit of FIG. 3, let us assume that the protective transistor $Q_1$ is in an on state, and that the pull-up transistor $Q_4$ is in an off state. In this condition, the potential at the base of the transistor $Q_1$ is clamped to the predetermined value Va. Therefore, even when the input terminal IN receives a signal of the L level after the cause of the short is removed, the transistor $Q_1$ is still kept on. Accordingly, when the input terminal IN receives a signal of the H level, a current is conducted from the power supply line through the resistor $R_1$, the diode $D_5$, and the transistor $Q_1$ to the output terminal OUT, so that the transistor $Q_2$ receives no base current. Therefore, the transistor $Q_2$ can not be turned on, even when the H level signal is applied to the input terminal until after the cause of the short is removed.

In practice, when the input terminal IN receives the L level signal after repairing the short, the potential at the base of the transistor $Q_1$ is lowered to turn it off, for resetting the line driver circuit.

Figure 5:
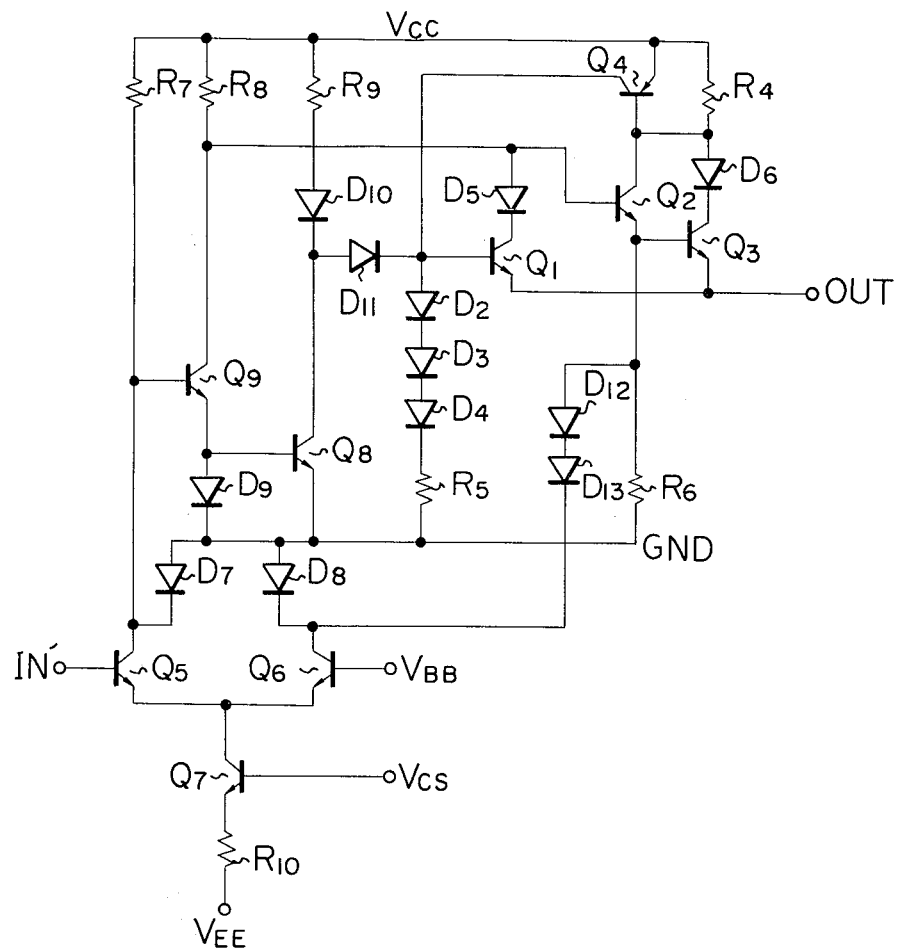

FIG. 5 is a circuit diagram illustrating a line driver circuit having a protective circuit against excess currents, a reset circuit, a discharge circuit, and a converting circuit for converting ECL level signals to TTL level signals, according to another embodiment of the present invention. Referring to FIG. 5, like reference characters designate the same or similar elements as in the circuit of FIG. 3. The difference between the circuit of FIG. 5 and the circuit of FIG. 3 is that, in FIG. 5, transistors $Q_5$, $Q_6$, $Q_7$, $Q_8$ and $Q_9$, diodes $D_7$ through $D_{13}$, and resistors $R_7$ through $R_{10}$ are provided. An input terminal IN' receives input signals which have two values, i.e., a high potential of zero volts (ground level) and a low potential of a negative voltage $V_{EE}$. The input terminal IN' is connected to the base of the transistor $Q_5$. The base of the transistor $Q_6$ is connected to a reference terminal for receiving a reference voltage $V_{BB}$ which has a value between zero volts and $V_{EE}$. The collector of the transistor $Q_5$ is connected through the pull-up resistor $R_7$ to the power supply line $V_{CC}$. The emitter-coupled transistors $Q_5$ and $Q_6$ consist of a differential pair transistors. The common emitters are connected through the transistor $Q_7$ and the resistor $R_{10}$ to the negative voltage source $V_{EE}$. When the input terminal IN' receives zero volts, the transistor $Q_5$ is on and the transistor $Q_6$ is off. When the input terminal IN' receive the negative voltage $V_{EE}$, the transistor $Q_5$ is off and the transistor $Q_6$ is on. The collector of the transistor $Q_5$ is also connected to the base of the transistor $Q_9$. The collector of the transistor $Q_9$ is connected through the pull-up resistor $R_8$ to the power supply line $V_{CC}$ and is also connected to the base of the transistor $Q_2$. The emitter of the transistor $Q_9$ is connected through a diode $D_9$ to the ground line GND and is also connected to the base of the resetting transistor $Q_8$. The collector of the transistor $Q_8$ is connected through the diode $D_{11}$ to the base of the transistor $Q_1$. The emitter of the transistor $Q_8$ is connected to the ground line GND. The collector of the transistor $Q_8$ is also connected through the diode $D_{10}$ and the resistor $R_9$ to the power supply line $V_{CC}$. The transistor $Q_8$ acts to reset the base potential of the transistor $Q_1$. Between the collector of the transistor $Q_5$ and the ground line GND, the diode $D_7$ is connected for preventing a reverse current when the transistor $Q_5$ is saturated. Between the base of the transistor $Q_3$ and the collector of the transistor $Q_6$, the diodes $D_{12}$ and $D_{13}$ are connected in series for discharging charges on the base of the transistor $Q_3$ when the transistor $Q_3$ is turned off. Between the ground line and the collector of the transistor $Q_6$, the diode $D_8$ is connected. The diode $D_8$ and the diodes $D_{12}$ and $D_{13}$ constitute a current switch.

The reset operation of the circuit of FIG. 5 will now be described. Let us assume again that the protective transistor $Q_1$ is in an on state, and that the pull-up transistor $Q_4$ is in an off state. In this condition, and after the short in the load resistor $R_L$ is repaired, when the input terminal IN' receives a signal of the negative voltage $V_{EE}$, then the transistor $Q_5$ is off; the transistor $Q_9$ in on; the transistor $Q_8$ is on; and therefore, the base potential of the transistor $Q_1$ is turned to the L level, so that the transistor $Q_1$ is turned off. After this, when the input terminal IN' receives a signal of zero volts, the transistor $Q_5$ is turned on and the transistor $Q_9$ is turned off so that a base current is supplied from the power supply line $V_{CC}$ through the resistor $R_8$ to the base of the transistor $Q_2$ to turn it on. Accordingly, the transistor $Q_3$ is turned on.

When the output stage transistor $Q_3$ is turned off, charges on the base of the transistor $Q_3$ are rapidly discharged through a discharge path including the diodes $D_{12}$ and $D_{13}$, the transistors $Q_6$ and $Q_7$, and the resistor $R_{10}$ to the negative voltage source $V_{EE}$.

The operations of the protective transistor $Q_1$, the pull-up transistor $Q_4$, and the excess-current detecting resistor $R_4$ are substantially the same as in the circuit of FIG. 3.

From the foregoing description, it will be apparent that, according to the present invention, in a line driver circuit having a protective circuit against excess currents, by providing a pull-up transistor for pulling up the base potential of the protective transistor, the maximum output current flowing through the output-stage transistor due to, for example, a short in the load resistor can be limited to a small amount in comparison with the conventional circuit. Further, according to the present invention, because the maximum output current depends only on the current detecting resistance and the characteristic of the pull-up transistor, the maximum output current can be determined more precisely than in the conventional circuit.

Various alterations and modification of the embodiment described will no doubt become apparent to those skilled in the art after having read the above disclosure. It is therefore intended that the following claims be interpreted to cover all such alternations and modifications as fall within the true spirit and scope of the invention.

What is claimed is:

1. A line driver circuit having a protective circuit against excess currents, comprising:
   an outut port;
   an emitter-follower circuit having an output connected to said output port and provided in an output stage of said line driver circuit;
   protective means, including a protective transistor having a base, for limiting the output current of said emitter-follower circuit;
   detecting means for detecting the output current of said emitter-follower circuit; and
   pull-up means, including a pull-up transistor which is turned on when the voltage detected by said detecting means exceeds a first predetermined value, that is, when a potential at said output port is lowered to a level lower than a second predetermined value, for pulling up the base potential of said protective transistor to turn on said protective transistor, the base potential of said protective transistor being pulled up until the potential at said output port exceeds said second predetermined value.

2. A line driver circuit as set forth in claim 1, wherein said detecting means comprises a resistor connected to said emitter follower circuit, and said output current being conducted through said resistor.

3. A line driver circuit as set forth in claim 2, wherein said pull-up transistor comprises a PNP transistor having a collector, an emitter and a base, said resistor being connected between said emitter and said base.

4. A line driver circuit as set forth in claim 3, wherein said protective transistor comprises an NPN transistor having a base connected to the collector of said pull-up transistor, and an emitter connected to an output port of said line driver circuit.

5. A line driver circuit as set forth in claim 4, wherein said emitter-follower circuit comprises:
   an output-stage NPN transistor having a collector and having an emitter connected to said output port; and
   means for connecting the collector of said output-stage NPN transistor to the base of said pull-up transistor.

6. A line driver circuit as set forth in claim 4, further comprising:
   a pair of differentially emitter connected transistors; and
   means for connecting one of the transistors of said pair to said emitter-follower circuit.

7. A line driver circuit as set forth in claim 6, wherein said means for connecting comprises at least one diode connected between the pair of differentially emitter connected transistors and the emitter-follower circuit.

8. A line driver circuit having an output port and a protective circuit against excess currents, comprising:
   an emitter-follower circuit provided in an output stage of said line driver circuit;
   protective means, including an NPN protective transistor having a base, for limiting the output current of said emitter-follower circuit;
   a detecting means for detecting the output current of said emitter-follower circuit, said detecting means comprising a resistor, and said output current being conducted through said resistor;
   pull-up means, including a pull-up transistor which is turned on when the voltage detected by said detecting means exceeds a predetermined value, for pulling up the base potential of said NPN protective transistor to turn on said NPN protective transistor, said pull-up transistor comprising a PNP transistor having a collector, an emitter and a base, said resistor being connected between said emitter and said base, said NPN protective transistor base being connected to the collector of said pull-up transistor, and said NPN protective transistor emitter being connected to the output port of said line driver circuit; and
   clamping means, connected between the base of said NPN protective transistor and ground, for clamping the base potential of said NPN protective transistor at a predetermined value lower than the sum of the output potential during the normal state when the output of said emitter-follower circuit is not shorted and $V_{BE}$, where $V_{BE}$ represents the base-emitter voltage for turning on said NPN protective transistor.

9. A line driver circuit having an excess current protective circuit connected between a power supply and ground, and having an output terminal, said line driver circuit for driving a load connected between the output terminal and ground, said line driver circuit comprising:
   an emitter-follower output stage connected to the output terminal;
   protective means, including a protective transistor having a base, connected to the output terminal and said emitter follower output stage, for limiting the output current of said emitter-follower output stage;
   detecting means, connected between the power supply and said emitter-follower output stage, for sensing the output current of said emitter-follower output stage; and
   means for raising the base potential of said protective transistor to turn it on when the current sensed by said detecting means exceeds a predetermined value.

10. A line driver circuit as set forth in claim 9, wherein said means for raising the base potential of said protective transistor includes a PNP transistor having a collector, an emitter connected to the power supply, and a base, and said detecting means includes a resistor connected between the power supply and said base of said PNP transistor.

11. A line driver circuit as set forth in claim 10, wherein said protective transistor comprises an NPN transistor having a base connected to the collector of said PNP transistor, and an emitter connected to the output terminal of said line driver circuit.

12. A line driver circuit as set forth in claim 11, further comprising a diode connected to the base of said PNP transistor, and wherein said emitter-follower output stage comprises an output-stage NPN transistor having a collector connected to said diode and having an emitter connected to said output terminal.

13. A line driver circuit having an output terminal and an excess current protective circuit, comprising:

an emitter-follower circuit;

a protective transistor for limiting the output current of said emitter-follower circuit, said protective transistor comprising an NPN transistor having a base and emitter;

detecting means for sensing the output current of said emitter-follower circuit, said detecting means including a resistor;

means for raising the base potential of said protective transistor to turn it on when the current sensed by said detecting means exceeds a predetermined value, said means for raising comprising a PNP transistor having a collector, an emitter and a base, and said resistor being connected between the emitter and the base, said NPN transistor base being connected to the collector of said PNP transistor, and said NPN transistor emitter being connected to the output terminal of said line driver circuit; and clamping means connected between the base of said NPN transistor and ground, for clamping the base potential of said NPN transistor at a predetermined value lower than the sum of the output potential in a normal state and the base-emitter voltage for turning on said protective transistor.

* * * * *

UNITED STATES PATENT AND TRADEMARK OFFICE
CERTIFICATE OF CORRECTION

PATENT NO. : 4,413,300
DATED : November 1, 1983
INVENTOR(S) : Sumi et al.

It is certified that error appears in the above-identified patent and that said Letters Patent is hereby corrected as shown below:

```
Front page, [56] OTHER PUBLICATIONS, "operational amplifier"
          should be --Operational Amplifier--;
                   "vol." should be --Vol.--.

Col. 3, line 21, "cut-of" should be --cut-off--;
        line 55, delete "OUT";
        line 56, after "nal" insert --OUT--.

Col. 5, line 52, "can not" should be --cannot--.
Col. 6, line 17, "receive" should be --receives--.
```

Signed and Sealed this

Eighteenth Day of December 1984

[SEAL]

Attest:

GERALD J. MOSSINGHOFF

*Attesting Officer*   *Commissioner of Patents and Trademarks*